(12) United States Patent
Sakuma

(10) Patent No.: US 6,899,767 B2
(45) Date of Patent: May 31, 2005

(54) METHOD OF CLEANING PROCESSING CHAMBER OF SEMICONDUCTOR PROCESSING APPARATUS

(75) Inventor: Takeshi Sakuma, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 189 days.

(21) Appl. No.: 10/441,003

(22) Filed: May 20, 2003

(65) Prior Publication Data
US 2003/0205237 A1 Nov. 6, 2003

Related U.S. Application Data

(63) Continuation-in-part of application No. PCT/JP01/08515, filed on Sep. 28, 2001.

(30) Foreign Application Priority Data

Nov. 20, 2000 (JP) ........................................ 2000-353312

(51) Int. Cl.[7] ................................................ B08B 3/00
(52) U.S. Cl. .............................. 134/26; 134/2; 134/3; 134/21; 134/22.1; 134/22.17; 134/22.18; 134/25.4; 134/28; 134/29; 134/31; 134/34; 134/35; 134/36; 134/37; 134/41; 134/42
(58) Field of Search .................. 134/2, 3, 21, 22.1, 134/22.17, 22.18, 25.4, 26, 28, 29, 31, 34, 35, 36, 37, 41, 42

(56) References Cited

U.S. PATENT DOCUMENTS

| 5,728,629 A | 3/1998 | Mizuno et al. ............. 438/680 |
| 5,756,400 A * | 5/1998 | Ye et al. ...................... 438/710 |
| 5,843,239 A * | 12/1998 | Shrotriya ..................... 134/1.1 |
| 5,849,092 A * | 12/1998 | Xi et al. ....................... 134/1.1 |
| 2002/0117472 A1 * | 8/2002 | Sun et al. ..................... 216/68 |

FOREIGN PATENT DOCUMENTS

| JP | 1-152274 | 6/1989 |
| JP | 2-190472 | 7/1990 |
| JP | 5-144802 | 6/1993 |
| JP | 11-135437 | 5/1999 |
| JP | 2000-173925 | 6/2000 |

* cited by examiner

Primary Examiner—Sharidan Carrillo
(74) Attorney, Agent, or Firm—Oblon, Spivak, McClelland, Maier & Neustadt, P.C.

(57) ABSTRACT

A method of cleaning the interior of a processing chamber first performs a halogenation treatment by supplying a treatment gas containing a halogenating gas into the processing chamber and heating a support member for a target substrate, thereby halogenating a metal element in a by-product film. A reduction treatment is then performed by supplying a treatment gas containing a reducing gas into the processing chamber, thereby reducing a halide of the metal element and liberating the metal element. An oxidation treatment is then performed by supplying a treatment gas containing an oxidizing gas into the processing chamber and heating the casing walls of the processing chamber, thereby passivating the liberated metal element by oxidation.

20 Claims, 2 Drawing Sheets

METHOD OF CLEANING PROCESSING CHAMBER OF SEMICONDUCTOR PROCESSING APPARATUS

CROSS REFERENCE TO RELATED APPLICATIONS

This is a Continuation-in-Part Application of PCT Application No. PCT/JP01/08515, filed Sep. 28, 2001, which was not published under PCT Article 21(2) in English.

This application is based upon and claims the benefit of priority from the prior Japanese Patent Application No. 2000-353312, filed Nov. 20, 2000, the entire contents of which are incorporated herein by reference.

BACKGROUND OF THE INVENTION

1. Field of the Invention

The present invention relates to a method of cleaning a processing chamber of a semiconductor processing apparatus, e.g., a CVD (Chemical Vapor Deposition) apparatus. Note that "semiconductor processing" means various processes performed to form semiconductor layers, insulating layers, conductive layers, and the like into predetermined patterns on a target substrate, such as a semiconductor wafer or LCD substrate, thereby fabricating a structure including a semiconductor device and lines, electrodes, and the like connected to the semiconductor device on the substrate.

2. Description of the Related Art

In the fabrication of a semiconductor device, various semiconductor processing apparatuses are used to perform processes, such as film formation, etching, oxidation, and diffusion, on a target substrate, e.g., a semiconductor wafer. As one type of such semiconductor processing apparatuses, a single-substrate heat-processing apparatus which processes wafers one by one is known. In a typical single-substrate heat-processing apparatus, a worktable (suscepter) for placing a wafer on it is disposed on the bottom of a processing chamber, and a shower head having a number of holes for supplying a process gas is disposed above the suscepter. An exhaust pipe for exhausting the processing chamber is connected to the processing chamber. A heater for heating a wafer is disposed below the suscepter.

As the material of the casing of the processing chamber, a corrosion-resistant material, such as anodized aluminum, stainless steel (SUS), or Ni, is used so that the material is not corroded by the process gas. As the material of the suscepter, a ceramic material having a high corrosion resistance is used.

In a CVD process for forming a thin film on the wafer surface, a process gas, such as $SiH_4$, $NH_3$, TEOS (tetraethylorthosilicate), $Ta(OC_2H_5)_5$, is used in accordance with the composition of the thin film. In this CVD process, the process gas provides a film material on the wafer surface by thermal decomposition, and a thin film is deposited on the wafer surface by this film material.

In the CVD process, at the same time the thin film is formed on the wafer surface, a decomposition product of any of the above process gases adheres as a so-called by-product film to the surfaces of, e.g., the suscepter as a wafer support member and the casing walls of the processing chamber. This film attaching to internal portions of the processing chamber except for the wafer builds up as the CVD process is repeated. When the thickness of the by-product film increases, the film cracks and peels off by, e.g., a temperature change in the processing chamber. Consequently, the peeled by-product film turns into particles and is deposited on the wafer surface to cause device defects.

To prevent this particle contamination caused by the by-product film, cleaning is performed for the constituent members of the processing chamber, e.g., the casing walls and the suscepter (which either contains or does not contain a built-in heater) of the processing chamber. Representative conventional cleaning methods are: (a) the surface layers of the processing chamber constituent members are etched with an etchant, such as an aqueous HF solution, and then heating is performed in an inactive gas ambient; and (b) the by-product film is etched away by heating the interior of the processing chamber in a halogen-based cleaning gas ambient. Unfortunately, these cleaning methods have the following drawbacks.

Method (a) requires a long cleaning time because wet cleaning is the main process. Also, the method requires complicated operations, such as detachment, disassembly, attachment, and assembly of the constituent members. This reduces the productivity because, e.g., the operating efficiency of the semiconductor processing apparatus lowers.

Method (b) is performed by heating the interior of the processing chamber by filling the processing chamber with a halogen-based cleaning gas, such as $ClF_3$, $NF_3$, $NCl_3$, $HCl$, $Cl_2$, $HF$, $F_2$, or $CF_4$. The processing chamber, after the CVD process, contains water whose sources are, e.g., adsorption of water by cold walls, a hydroxyl group contained in the process gas, and water contained in the film itself. This residual water reacts with a halogen element contained in the cleaning gas to produce hydrogen halide. This hydrogen halide corrodes the metal of the casing of the processing chamber, and the produced metal halide scatters on the wafer to cause metal contamination. Even if no water exists in the processing chamber, a halogen element remains in the processing chamber and corrodes the constituent members of the processing chamber in subsequent processes. This results in an adverse effect, such as metal contamination of the wafer.

Methods of preventing this metal contamination are: (c) before a predetermined process, cleaning is performed by the same type of gas as a process gas used in the predetermined process (Jpn. Pat. Appln. KOKAI Publication No. 5-144802); and (d) the surface layers of the constituent members of the processing chamber are thermally oxidized to passivate impurities in these surface layers by oxidation, thereby reducing or suppressing diffusion of the impurities (Jpn. Pat. Appln. KOKAI Publication No. 11-135437). Unfortunately, these methods have the following drawbacks.

In method (c), etching is performed by the same type of gas as a process gas, but the process gas itself is not an optimal etchant. That is, all metal elements cannot be removed, so the cleaning effect is limited. In fact, according to Jpn. Pat. Appln. KOKAI Publication No. 5-144802, cleaning by the process gas is performed after the surface of an object is etched with a chemical, resulting in a complicated operation. Also, this method cannot remove a thickly adhered by-product film, so the method cannot eliminate the cause of particle contamination.

Method (d) forcedly oxidizes the surface layers of the processing chamber constituent members, i.e., passivates these surface layers, thereby suppressing diffusion of impurities. Accordingly, even when cleaning is performed by this method, metal elements themselves are not reduced in the processing chamber. That is, when this method is used, metal oxides build up in the processing chamber although cleaning is performed. This limits the number of times of cleaning which can be performed by repeating this method alone. Furthermore, this method cannot remove the by-product film itself either, so the method cannot eliminate the cause of particle contamination.

As described above, either of the conventional cleaning methods cannot well eliminate the cause of particle contamination and the cause of metal contamination. Therefore, when either cleaning method is used, the reliability of semiconductor device fabrication worsens, and this consequently lowers the productivity and increases the production cost. Especially because semiconductor devices are presently advancing in performance and integration degree, a more effective semiconductor processing apparatus cleaning technique is expected.

BRIEF SUMMARY OF THE INVENTION

It is an object of the present invention to provide a method of cleaning a processing chamber of a semiconductor processing apparatus, which can be effectively performed with a simple operation and can contribute to mass-production of semiconductor devices.

A first aspect of the present invention is a method of cleaning a processing chamber in a semiconductor processing apparatus comprising the processing chamber which is airtight and accommodates a target substrate, and a support member which supports the substrate in the processing chamber, the method comprising performing a halogenation treatment by supplying a treatment gas containing a halogenating gas into the processing chamber and heating the support member, the halogenation treatment being so performed as to halogenate a metal element in a by-product film attaching to the support member, thereby removing the metal element from the support member, performing a reduction treatment after the halogenation treatment by supplying a treatment gas containing a reducing gas into the processing chamber, the reduction treatment being so performed as to reduce a metal element halide produced by the halogenation treatment and attaching to a casing wall of the processing chamber, thereby liberating a metal element, and performing an oxidation treatment after the reduction treatment by supplying a treatment gas containing an oxidizing gas into the processing chamber and heating the casing wall of the processing chamber, the oxidation treatment being so performed as to oxidize and thereby passivate the metal element liberated by the reduction treatment on the casing wall of the processing chamber.

A second aspect of the present invention is a method of cleaning a processing chamber in a semiconductor processing apparatus comprising the processing chamber which is airtight and accommodates a target substrate, and a support member which supports the substrate in the processing chamber, the method comprising performing a dehydration treatment which removes water present in the processing chamber, performing a halogenation treatment after the dehydration treatment by supplying a treatment gas containing a halogenating gas into the processing chamber and heating the support member, the halogenation treatment being so performed as to halogenate a metal element in a by-product film attaching to the support member, thereby removing the metal element from the support member, performing a reduction treatment after the halogenation treatment by supplying a treatment gas containing a reducing gas into the processing chamber, the reduction treatment being so performed as to reduce a metal element halide produced by the halogenation treatment and attaching to a casing wall of the processing chamber, thereby liberating a metal element, and performing an oxidation treatment after the reduction treatment by supplying a treatment gas containing an oxidizing gas into the processing chamber and heating the casing wall of the processing chamber, the oxidation treatment being so performed as to oxidize and thereby passivate the metal element liberated by the reduction treatment on the casing wall of the processing chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be described below with reference to the accompanying drawings. Note that cleaning methods to be explained below as the first and second embodiments are applicable to the same apparatus and include common steps, so a repetitive explanation will be made only where necessary.

Figure 1:
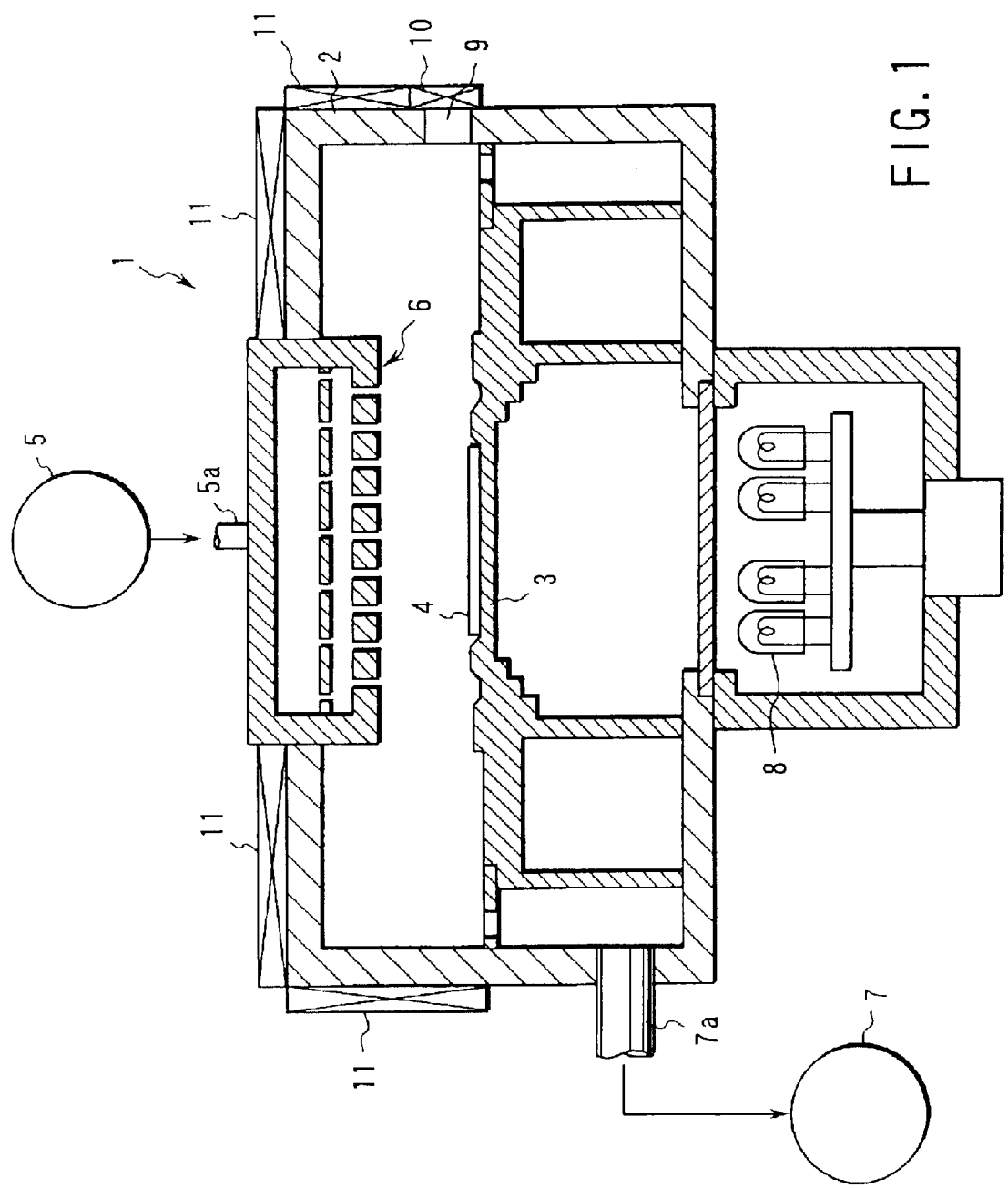
FIG. 1 is a schematic view showing the arrangement of a single-substrate CVD apparatus as an example of a semiconductor processing apparatus to which cleaning methods according to embodiments of the present invention are applied.

FIG. 1 is a schematic view showing the arrangement of a single-substrate CVD apparatus as an example of a semiconductor processing apparatus to which cleaning methods according to embodiments of the present invention are applied. As shown in FIG. 1, a CVD apparatus 1 has an airtight processing chamber 2 for accommodating a semiconductor wafer 4, typically, a silicon wafer, as a target substrate. A heater 11 for heating the casing walls of the processing chamber 2 is disposed around the processing chamber 2. In the processing chamber 2, a worktable (susceptor) 3 which is a support member for supporting the wafer 4 in the processing chamber 2 is disposed. As the material of the casing of the processing chamber 2, a corrosion-resistant material, such as anodized aluminum, stainless steel (SUS), or Ni, is used so that the material is not corroded by a process gas. As the material of the susceptor 3, a ceramic material having a high corrosion resistance is used.

A shower head 6 having a number of holes for supplying a process gas is disposed above the susceptor 3. A supply unit 5 for supplying a process gas, cleaning gas, inactive gas, and the like is connected to the center of the upper portion of the shower head 6 via a line 5a. To exhaust the processing chamber 2, an exhaust unit 7 which includes an exhaust pump, pressure controller, and the like is connected to the processing chamber 2 via a line 7a. A port 9 for loading/unloading the wafer 4 is also formed in the processing chamber 2. A gate valve 10 for holding the airtightness of the interior of the processing chamber 2 is attached to the port 9. Outside the processing chamber 2, a lamp 8 which is a heater for heating the wafer 4 is disposed below the susceptor 3. Note that a susceptor having a built-in heating-wire heater can also be used instead of the lamp heating type susceptor.

A CVD process performed for the wafer 4 by using the CVD apparatus 1 and cleaning after that will be described below.

(First Embodiment)

First, the wafer 4 is loaded into the processing chamber 2 through the port 9 and placed on the susceptor 3 by a transfer arm (not shown). After the gate value 10 of the port 9 is closed, the processing chamber 2 is evacuated by the exhaust unit 7 to set the processing chamber 2 in a vacuum. While the processing chamber 2 is thus evacuated, a CVD process gas (e.g., a mixture of Ar, $O_2$ and $SiH_4$) is introduced into the processing chamber 2, and the susceptor 3 is heated to a high temperature by the lamp 8, thereby performing a CVD process. After this CVD process, the gate valve 10 is opened, and the processed wafer 4 is extracted outside the processing chamber 2 through the port 9 by the transfer arm (not shown).

When the above CVD process is performed a plurality of number of times, a reaction product of the process gas, i.e., a so-called by-product film builds up on, e.g., the casing walls of the processing chamber 2 and the susceptor 3. This by-product film may act as a particle source. Therefore, the interior of the processing chamber 2 and the like are cleaned by the following treatments at this point.

Figure 2:
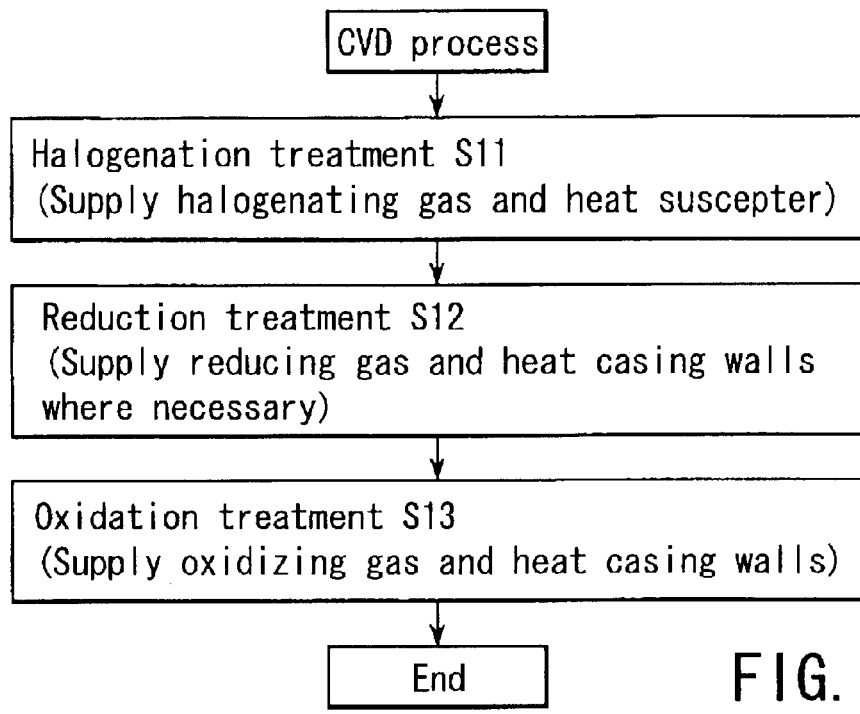
FIG. 2 is a flow chart showing the relationship between a cleaning method according to the first embodiment of the present invention and a CVD process.

FIG. 2 is a flow chart showing the relationship between the cleaning method according to the first embodiment of the present invention and the CVD process. As shown in FIG. 2, in the method according to the first embodiment, halogenation treatment S11, reduction treatment S12, and oxidation treatment S13 are performed in this order after the CVD process is performed a predetermined number of times.

[Halogenation Treatment S11]

In the cleaning method according to the first embodiment, a halogenation treatment is performed first by supplying a treatment gas containing a halogenating gas into the processing chamber 2, and heating at least the susceptor (support member) 3. This halogenation treatment is so performed as to form a halide having a high vapor pressure by a reaction from a metal element in a by-product film attaching to the susceptor 3 and its vicinity, thereby removing the by-product film from these portions. It is also possible to heat the casing side walls of the processing chamber 2, thereby halogenating a metal element in a by-product film attaching to the side walls.

More specifically, after the internal pressure of the processing chamber 2 is set to a vacuum by the exhaust unit 7, a treatment gas containing a halogenating gas is introduced into the processing chamber 2, the susceptor 3 is heated by the lamp 8, and the casing walls of the processing chamber 2 are heated by the heater 11 where necessary. The halogenation treatment can be performed by supplying the treatment gas while the processing chamber 2 is evacuated. Instead, the halogenation treatment can be performed by alternately repeating evacuation of the processing chamber 2 and supply of the treatment gas. The latter method is more desirable because the method facilitates diffusion of the treatment gas and exhaustion of the produced gas to and from a place where a gas easily stays.

The halogenating gas can be selected from the group consisting of a halogen, an interhalogen compound, hydrogen halide, nitrogen halide, and carbon halide. Desirably, the halogenating gas can be selected from the group consisting of $ClF_3$, HF, HCl, $F_2$, $Cl_2$, $NF_3$, $NCl_3$, and $CF_4$. These gases can be used singly, or two or more types of them can be mixed. Of these halogenating gases, $ClF_3$ is desirable since it can react under moderate conditions at about room temperature when the by-product film is to be etched.

A gas for the halogenation treatment can contain only the halogenating gas and can also contain an inactive gas for dilution, such as nitrogen gas or argon gas. The concentration of the halogenating gas in this treatment gas can be 10 to 100 vol %. The flow rate of the treatment gas can be 100 to 1,000 SCCM, although it depends on the volume of the processing chamber 2, the type of gas used, and the halogenating gas concentration. The internal pressure of the processing chamber 2 can be 13.33 to 13,330 Pa (0.1 to 100 Torr).

When $ClF_3$ is to be used in the halogenation treatment, the temperature of the susceptor 3 can be 200 to 600° C., and preferably, 200 to 300° C. The treatment time can be about 10 to 60 min. If the treatment temperature and time fall below the above ranges, no satisfactory halogenation can be expected. On the other hand, a treatment temperature and time exceeding the above ranges are economically disadvantageous because halogenation does not improve in proportion to the energy consumption.

In the halogenation treatment, the halogenating gas acts on a by-product film deposited on the susceptor 3 and its vicinity and on the casing walls of the processing chamber 2, thereby converting metal elements forming this by-product film into halides. Of the produced metal halides, a fluoride and chloride having high vapor pressures are exhausted in the form of gases outside the system. Halides of metal elements such as Fe, Al, and Cr, have low vapor pressures and hence often stay on the casing walls of the processing chamber 2. However, these residual metal halides are made to have no adverse effect on the CVD process by the following treatment.

[Reduction Treatment S12]

Next, a reduction treatment is performed by supplying a treatment gas containing a reducing gas into the processing chamber 2. This reduction treatment is so performed as to reduce those halides of metal elements, which are produced by the halogenation treatment and attach to at least the casing walls of the processing chamber 2, thereby liberating the metal elements.

More specifically, the halogenating gas supplied in the halogenation treatment is stopped, and the halogenating gas in the processing chamber 2 is exhausted by the exhaust unit 7. After the internal pressure of the processing chamber is set to a vacuum by the exhaust unit 7, a treatment gas containing a reducing gas is introduced into the processing chamber 2, and, if necessary, the casing walls of the processing chamber 2 are heated by the heater 11. In addition, the susceptor 3 is heated by the lamp 8 as needed. The reduction treatment can be performed by supplying the treatment gas while the processing chamber 2 is evacuated. Instead, the reduction treatment can be performed by alternately repeating evacuation of the processing chamber 2 and supply of the treatment gas. The latter method is more desirable because the method facilitates diffusion of the treatment gas and exhaustion of the produced gas to and from a place where a gas easily stays.

The reducing gas can be selected from the group consisting of silicon hydride (e.g., $SiH_4$ or $Si_2H_6$), hydrogen ($H_2$), and ammonia ($NH_3$). These gases can be used singly, or two or more types of them can be mixed. These reducing gases react with halides in the processing chamber 2 to form silicon halide or hydrogen halide which is highly volatile, and are readily exhausted outside the processing chamber 2. If water exists in the processing chamber 2, $SiH_4$ or $Si_2H_6$ removes this water by reacting with the water to form silicon dioxide, thereby preventing corrosion of the processing chamber 2. Of these reducing gases, $Si_2H_6$ is desirable since it can start reacting at relatively low temperatures.

A gas for the reduction treatment can contain only the reducing gas and can also contain an inactive gas for dilution, such as nitrogen gas or argon gas. The concentration of the reducing gas in this treatment gas can be 1 to 100 vol %. Although the flow rate of the treatment gas depends on the volume of the processing chamber 2, the type of gas used, and the reducing gas concentration, this flow rate can be 10 to 1,000 SCCM in a single-substrate processing apparatus and 1,000 to 2,000 SCCM in a batch processing apparatus. The internal pressure of the processing chamber 2 can be 1.333 to 133.3 Pa (0.01 to 1 Torr).

If the reducing gas is silicon hydride in the reduction treatment, the casing wall temperature of the processing chamber 2 can be room temperature to 200° C., and preferably, 150 to 200° C. If the reducing gas is hydrogen, the casing wall temperature of the processing chamber 2 can be room temperature to 900° C., and preferably, 800 to 900° C. The treatment time can be about 1 to 10 min in a single-substrate processing apparatus, and about 10 to 60 min in a batch processing apparatus. If the treatment temperature falls below the above ranges, reduction of the metal halides produced in the halogenation treatment does not well progress, so no satisfactory dehalogenating effect can be achieved. If the treatment temperature exceeds the above ranges, $SiH_4$ or $Si_2H_6$ itself thermally decomposes to form a by-product film in the processing chamber 2.

If the reducing gas is silicon hydride in the reduction treatment, this reducing gas reacts with a halide remaining in the processing chamber 2 to produce a silicon fluoride or silicon chloride having a high vapor pressure. If the reducing gas is hydrogen gas, this reducing gas reacts with a halide remaining in the processing chamber 2 to produce hydrogen halide. The gas produced in the reduction treatment is exhausted outside the processing chamber 2 through the exhaust pipe 7. Consequently, halogen elements are exhausted outside the system, and metal elements in the by-product film are reduced and liberated as highly active metal elements which primarily remain on the casing walls of the processing chamber 2.

[Oxidation Treatment S13]

Subsequently, an oxidation treatment is performed by supplying a treatment gas containing an oxidizing gas into the processing chamber 2 and heating at least the casing walls of the processing chamber 2. This oxidation treatment is so performed as to oxidize and thereby passivate the metal elements which remain on the casing walls of the processing chamber 2 after being liberated by the reduction treatment.

More specifically, the reducing gas supplied in the reduction treatment is stopped, and the reducing gas in the processing chamber 2 is exhausted by the exhaust unit 7. After the internal pressure of the processing chamber 2 is set to a vacuum by the exhaust unit 7, a treatment gas containing an oxidizing gas is introduced into the processing chamber 2, and the casing walls of the processing chamber 2 are heated by the heater 11. If necessary, the susceptor 3 is heated by the lamp 8. The oxidation treatment can be performed by supplying the treatment gas while the processing chamber 2 is evacuated. Instead, the oxidation treatment can be performed by alternately repeating evacuation of the processing chamber 2 and supply of the treatment gas. The latter method is more desirable because the method facilitates diffusion of the treatment gas and exhaustion of the produced gas to and from a place where a gas easily stays.

The oxidizing gas can be selected from the group consisting of $O_2$, $N_2O$, $NO_2$, $NO$, and $O_3$. These gases can be used singly, or two or more types of them can be mixed. Of these oxidizing gases, $N_2O$ is desirable because it has a high oxidizing power and can passivate metals under relatively moderate conditions, and $O_2$ is desirable because it is inexpensive.

A gas for the oxidation treatment can contain only the oxidizing gas and can also contain an inactive gas for dilution, such as nitrogen gas or argon gas. The concentration of the oxidizing gas in this treatment gas can be 10 to 100 vol %. The flow rate of the treatment gas can be 100 to 1,000 SCCM, although it depends on the volume of the processing chamber 2, the type of gas used, and the oxidizing gas concentration. The internal pressure of the processing chamber 2 can be 133.3 to 13,330 Pa (1 to 100 Torr).

In the oxidation treatment, the casing wall temperature of the processing chamber 2 can be 500 to 1,000° C., and preferably, 800 to 900° C. If heating is continuously performed in an oxidizing gas ambient, the treatment time can be 1 to 2 hrs. If heating in an oxidizing gas ambient and heating in a vacuum are repeated, a cycle in which each of these two treatment portions is performed for 5 min can be performed for about 2 hrs.

In the oxidation treatment, metal elements as impurities remaining on and attaching to the casing walls of the processing chamber 2 are oxidized and fixed as they are passivated. That is, metal elements remaining without being removed through the above treatments are oxidized into stable oxides in this oxidation treatment. Accordingly, in a CVD process performed later, these oxides do not split off from the processing chamber casing walls by ionization or evaporation, and hence do not cause any metal contamination.

In cleaning performed through the three treatments described above, PolySi and metals, such as W, Ti, and Ta, can be exhausted outside the system by the halogenation treatment. The halogen element itself can be removed by the reduction treatment. In addition, metal elements, such as Fe which cannot be well removed by these treatments, can be oxidized and fixed as they are passivated by the oxidation treatment so as not to cause any metal contamination. Furthermore, the possibility of corrosion of the processing chamber constituent metals in the halogenation treatment can be avoided by the reduction treatment. Also, even if a metal which easily scatters is produced by corrosion, this metal can be passivated by the oxidation treatment. This further improves the contamination preventing effect.

(Second Embodiment)

If a halogenation treatment is performed in an environment in which water exists in a processing chamber, this water reacts with a halogen element to produce hydrogen halide. Hydrogen halide produced in a non-controlled state may corrode the constituent elements of the processing chamber 2 to cause metal contamination. A cleaning method according to the second embodiment solves this problem.

Figure 3:
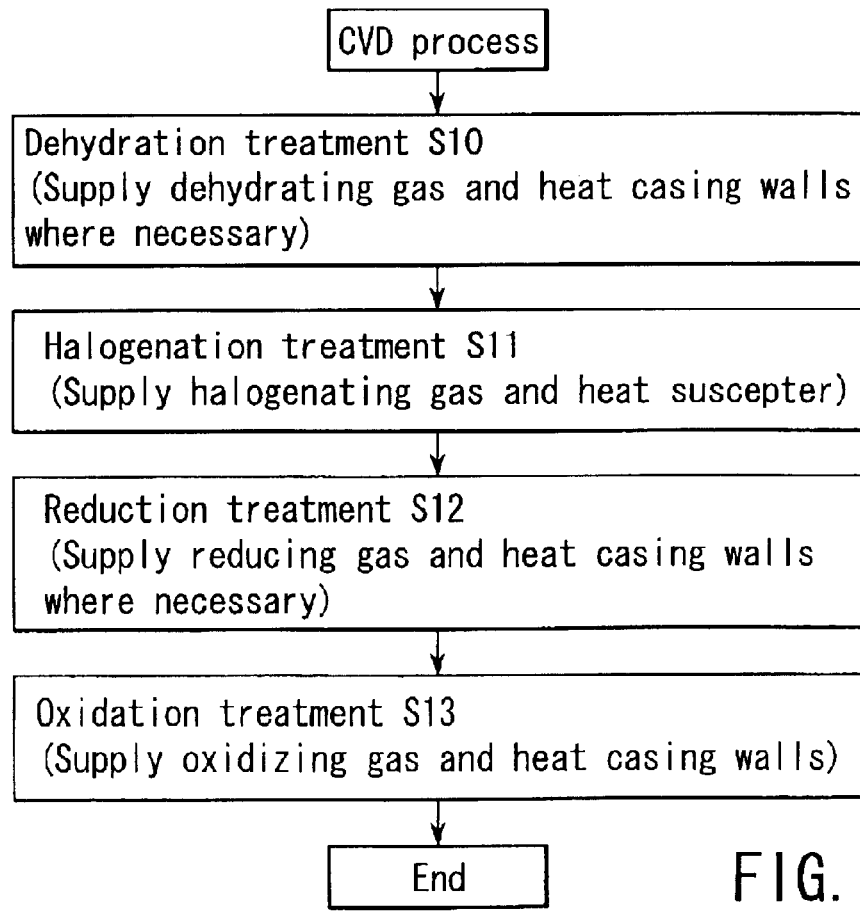
FIG. 3 is a flow chart showing the relationship between a cleaning method according to the second embodiment of the present invention and a CVD process.

FIG. 3 is a flow chart showing the relationship between the cleaning method according to the second embodiment of the present invention and the CVD process. As shown in FIG. 2, in the method according to the second embodiment, after the CVD process is performed a predetermined number of times, dehydration treatment S10 for removing water present in the processing chamber 2 is performed first. Then, halogenation treatment S11, reduction treatment S12, and oxidation treatment S13 described above are performed in this order. That is, the method according to the second embodiment differs from the method according to the first embodiment in that dehydration treatment S10 is performed before halogenation treatment S11.

This embodiment is effective when water is produced as a by-product in the CVD process of semiconductor device fabrication. If a Cl-based gas, for example, is supplied for a halogenation treatment while water produced in the CVD process remains in the processing chamber, this gas reacts with the water to produce HCl. HCl corrodes the casing walls of the processing chamber and the like, and substances produced by this corrosion act as contamination sources.

In this dehydration treatment, a treatment gas containing a reductive dehydrating gas, such as $SiH_4$ or $Si_2H_6$, is supplied into the processing chamber 2. Water in the processing chamber 2 reacts with the reductive dehydrating gas as indicated by $2H_2O+SiH_4 \rightarrow SiO_2+4H_2$. Accordingly, even if a halogenation treatment is performed after that, no hydrogen halide, such as HCl, is produced in the processing chamber 2. This eliminates metal contamination caused by corrosion of the constituent members of the processing chamber 2. Note that $SiO_2$ produced by decomposition of water is readily etched away by, e.g., a fluorine-based gas in the subsequent halogenation treatment.

The dehydration treatment as the difference between the cleaning methods according to the first and second embodiments will be described in detail below.

[Dehydration Treatment S10]

When cleaning is to be performed after the CVD process, a dehydration treatment is first performed by supplying a treatment gas containing a reductive dehydrating gas into the processing chamber 2. In this dehydration treatment, the dehydrating gas is allowed to react with water in the processing chamber 2, thereby removing the water present in the processing chamber 2.

More specifically, after the internal pressure of the processing chamber 2 is set to a vacuum by the exhaust unit 7, a treatment gas containing a dehydrating gas is introduced into the processing chamber 2, and, if necessary, the casing walls of the processing chamber 2 are heated by the heater 11. In addition, the suscepter 3 is heated by the lamp 8 as needed. The dehydration treatment can be performed by supplying the treatment gas while the processing chamber 2 is evacuated. Instead, the dehydration treatment can be performed by alternately repeating evacuation of the processing chamber 2 and supply of the treatment gas. The latter method is more desirable because the method facilitates diffusion of the treatment gas and exhaustion of the produced gas to and from a place where a gas easily stays.

Similar to the reducing gas described earlier, the reductive dehydrating gas can be silicon hydride (e.g., $SiH_4$ or $Si_2H_6$). These gases can be used singly, or two or more types of them can be mixed. Note that $H_2$ cannot be used as a dehydrating gas because no dehydrating effect by a reaction with water can be expected. Of these dehydrating gases, $Si_2H_6$ is desirable since it can start reacting at relatively low temperatures.

A gas for the dehydration treatment can contain only the dehydrating gas and can also contain an inactive gas for dilution, such as nitrogen gas or argon gas. The concentration of the dehydrating gas in this treatment gas can be 1 to 100 vol %. The flow rate of the treatment gas can be 10 to 100 SCCM, although it depends on the volume of the processing chamber 2, the type of gas used, and the dehydrating gas concentration. The internal pressure of the processing chamber 2 can be 1.333 to 133.3 Pa (0.01 to 1 Torr).

In the dehydration treatment, the casing wall temperature of the processing chamber 2 can be room temperature to 200° C., and preferably, 150 to 200° C. The treatment time can be about 1 to 10 min. If the treatment temperature falls below the above range, the reaction with water in the processing chamber 2 does not well progress, so no satisfactory dehydrating effect can be achieved. If the treatment temperature exceeds the above range, $SiH_4$ or $Si_2H_6$ itself thermally decomposes to form a by-product film in the processing chamber 2.

After dehydration treatment S10 is performed, halogenation treatment S11, reduction treatment S12, and oxidation treatment S13 are performed in this order as in the first embodiment. Consequently, the interior of the processing chamber 2 can be cleaned without corroding the constituent members of the processing chamber 2, so metal impurity contamination can be prevented.

In the first and second embodiments, the halogenation treatment is performed to halogenate metal elements contained in a by-product film. Therefore, etching can also be performed by using a halogen element-containing solution instead of the halogenating gas described previously. It is also possible to add a step of physically removing a by-product film prior to cleaning.

A CVD apparatus to which the present invention is applicable is a thermal CVD apparatus which deposits a film made of, e.g., polysilicon, SiN, or a high-constant dielectric metal oxide on a wafer by thermal decomposition, or a plasma CVD apparatus which deposits a film made of, e.g., $SiO_2$, SiN, or Ti. Also, the present invention can be applied not only to a CVD apparatus but also to semiconductor processing apparatuses, such as a diffusion apparatus for diffusing and implanting an impurity, an etching apparatus for performing micropatterning, a sputtering apparatus, and an oxidizing apparatus for forming an oxide film. The present invention is applicable to both a single-substrate processing apparatus and batch processing apparatus. In addition, the present invention can be applied to an apparatus in which another wafer handling member, such as a wafer boat or wafer transfer robot, is installed in a processing chamber. Furthermore, a target substrate is not limited to a semiconductor wafer, and the present invention is applicable to a glass substrate and LCD substrate.

[Experiment 1]

The CVD apparatus shown in FIG. 1 was used. The silicon wafer 4 was placed on the suscepter 3 through the port 9, and the casing walls of the processing chamber 2 were held at 170° C.

(1) CVD Process

Next, the interior of the processing chamber 2 was maintained at 500° C. and 3 Torr, a process gas containing 50 mg of PET (PentaEthoxyTantalum: $Ta(OC_2H_5)_5$), 300 SCCM of He, and 1 SLM of $O_2$ was supplied from the shower head 6. Heating was continued for 2 min for each wafer to form a thin $Ta_2O_5$ film on the wafer surface.

(2) Halogenation Treatment

After the silicon wafer 4 on which the film was formed was unloaded from the processing chamber 2, the gate valve 10 was closed, and the processing chamber 2 was evacuated by the exhaust unit 7 to exhaust the process gas used in film formation. Subsequently, the suscepter 3 was heated to 300° C. by the lamp 8, a halogenation treatment gas containing 500 SCCM of $ClF_3$ and 0.5 SLM of $N_2$ was introduced into the processing chamber, and heating was performed for 60 min while a pressure of 399.9 Pa (3 Torr) was maintained.

(3) Reduction Treatment

Supply of the halogenation treatment gas was stopped, and the halogenating gas in the processing chamber 2 was exhausted by the exhaust unit 7.

The casing walls of the processing chamber 2 were held at 250° C. by the heater 11, a reduction treatment gas containing 100 SCCM of $SiH_4$ and 1 SLM of $N_2$ was introduced into the processing chamber 2, and heating was performed for 5 min or more while a pressure of 13.33 Pa (0.1 Torr) was maintained.

(4) Oxidation Treatment

Supply of the reducing gas was stopped, and the reducing gas in the processing chamber 2 was exhausted by the exhaust unit 7.

The casing walls of the processing chamber 2 were held at 500° C. by the heater 11, and an oxidation treatment gas containing 1 SLM of Ar, 1 SLM of $O_2$, and 1 SLM of $N_2$ was introduced into the processing chamber 2. An oxidation treatment was performed for 2 hrs by repeating a step of performing heating while supplying the oxidation treatment gas at a pressure of 666.5 Pa (5 Torr) for 2 min, and a step of performing evacuation for 2 min.

(5) Evaluation

A silicon wafer 4 was placed in the processing chamber 2 cleaned following the above procedure. After an inactive gas was sprayed against the wafer surface under heating (in order to obtain the same environment as in the process), the metal contamination amount on the wafer surface was measured. The amount of contamination metal was measured by ICP mass spectrometry. Note that the lower measurement limit of this ICP mass spectroscopy was $2 \times 10^9$ atoms/cm$^2$.

The experimental results obtained by the processing chamber cleaned by the method according to the present invention are shown as Example 1 in Table 1. In Table 1, the unit of a numerical value indicating the contamination metal amount is $1 \times 10^{10}$ atom/cm$^2$. Also, "analyzed surfaces" are a lower surface which is a wafer surface in contact with the suscepter surface, and an upper surface against which the inactive gas was sprayed.

In Table 1, "reference example" indicates a sample of a silicon wafer (bare wafer) against which no inactive gas was sprayed at all. "Comparative Example 1" indicates a sample of a silicon wafer against which the inactive gas was sprayed in the processing chamber 2 before cleaning was performed. "Comparative Example 2" indicates a sample of a silicon wafer against which the inactive gas was sprayed in the processing chamber 2 immediately after the halogenation treatment was performed as in Example 1. "Comparative Example 3" indicates a sample of a silicon wafer against which the inactive gas was sprayed in the processing chamber 2 immediately after the oxidation treatment was performed after the halogenation treatment as in Example 1. "Comparative Example 4" indicates a sample of a silicon wafer against which the inactive gas was sprayed in the processing chamber 2 immediately after the reduction treatment was performed after the halogenation treatment. The amount of metal impurity on the surface of each of these samples was also measured by the same method as in Example 1.

As is apparent from the results shown in Table 1, metal contamination was significantly improved in Example 1 compared to the results of the comparative examples.

[Experiment 2]

The CVD apparatus shown in FIG. 1 was used. The silicon wafer 4 was placed on the susceptor 3 through the port 9, and the casing walls of the processing chamber 2 were held at 170° C.

(11) Film Formation Step

Next, the interior of the processing chamber 2 was maintained at 500° C. and 3 Torr, a process gas containing 50 mg of PET (PentaEthoxyTantalum: $Ta(OC_2H_5)_5$), 300 SCCM of He, and 1 SLM of $O_2$ was supplied from the shower head 6. Heating was continued for 2 min for each wafer to form a thin $Ta_2O_5$ film on the wafer surface.

(12) Dehydration Treatment

After the silicon wafer 4 on which the film was formed was unloaded from the processing chamber 2, the gate valve 10 was closed, and the processing chamber 2 was evacuated by the exhaust unit 7 to exhaust the process gas used in film formation.

The casing walls of the processing chamber 2 were held at 250° C. by the heater 11, a dehydration treatment gas containing 100 SCCM of $SiH_4$ and 1 SLM of $N_2$ was introduced into the processing chamber 2, and heating was performed for 5 min or more while a pressure of 13.33 Pa (0.1 Torr) was maintained.

Following the same procedures as in Experiment 1, (2) halogenation treatment, (3) reduction treatment, and (4) oxidation treatment were performed. Consequently, as in Experiment 1, cleaning of Experiment 2 greatly improved metal contamination compared to cleaning by the halogenation treatment.

TABLE 1

| | Analyzed Surfaces | Metal Impurity Contents | | |
|---|---|---|---|---|
| | | Fe | Ni | Cu |
| Reference Example | Upper surface | 0.5 | Lower measurement limit or less | Lower measurement limit or less |
| Example 1 | Lower surface | 30 | 4.5 | 5.0 |
| | Upper surface | 24 | 3.1 | 4.0 |
| Comparative Example 1 | Lower surface | 5000 | 350 | 1630 |
| | Upper surface | 380 | 13 | 210 |
| Comparative Example 2 | Lower surface | 79 | 18 | 36 |
| | Upper surface | 52 | 10 | 20 |
| Comparative Example 3 | Upper surface | 42 | 7 | 10 |
| Comparative Example 4 | Upper surface | 30 | 4 | 4.5 |

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of cleaning a processing chamber in a semiconductor processing apparatus comprising the processing chamber which is airtight and accommodates a target substrate, and a support member which supports the substrate in the processing chamber, the method comprising:

performing a halogenation treatment by supplying a treatment gas containing a halogenating gas into the processing chamber and heating the support member, the halogenation treatment being so performed as to halogenate a metal element in a by-product film attaching to the support member, thereby removing the metal element from the support member;

performing a reduction treatment after the halogenation treatment by supplying a treatment gas containing a reducing gas into the processing chamber, the reduction treatment being so performed as to reduce a metal element halide produced by the halogenation treatment and attaching to a casing wall of the processing chamber, thereby liberating a metal element; and performing an oxidation treatment after the reduction treatment by supplying a treatment gas containing an oxidizing gas into the processing chamber and heating the casing wall of the processing chamber, the oxidation treatment being so performed as to oxidize and thereby passivate the metal element liberated by the reduction treatment on the casing wall of the processing chamber.

2. The method according to claim 1, wherein the halogenating gas is selected from the group consisting of a halogen, interhalogen compound, hydrogen halide, nitride halide, and carbon halide.

3. The method according to claim 1, wherein the reducing gas is selected from the group consisting of silicon hydride, hydrogen, and ammonia.

4. The method according to claim 1, wherein the oxidizing gas is selected from the group consisting of $O_2$, $N_2O$, $NO_2$, NO, and $O_3$.

5. The method according to claim 1, wherein in one or a plurality of the halogenation treatment, reduction treatment, and oxidation treatment, the treatment gas is supplied while the processing chamber is evacuated.

6. The method according to claim 1, wherein in one or a plurality of the halogenation treatment, reduction treatment, and oxidation treatment, evacuation of the processing chamber and supply of the treatment gas are alternately repeated.

7. The method according to claim 1, wherein in one or a plurality of the halogenation treatment, reduction treatment, and oxidation treatment, the treatment gas further contains an inactive gas for dilution.

8. The method according to claim 2, wherein the halogenating gas is selected from the group consisting of $ClF_3$, HF, HCl, $F_2$, $Cl_2$, $NF_3$, $NCl_3$, and $CF_4$.

9. The method according to claim 2, wherein a temperature of the support member of the processing chamber is set at 200 to 600° C. in the halogenation treatment.

10. The method according to claim 3, wherein the reducing gas is selected from the group consisting of $SiH_4$ and $Si_2H_6$, and a temperature of the casing wall of the processing chamber is set at room temperature to 200° C. in the reduction treatment.

11. The method according to claim 3, wherein the reducing gas is $H_2$, and a temperature of the casing wall of the processing chamber is set at room temperature to 900° C. in the reduction treatment.

12. The method according to claim 4, wherein a temperature of the casing wall of the processing chamber is set at 500 to 1,000° C. in the oxidation treatment.

13. A method of cleaning a processing chamber in a semiconductor processing apparatus comprising the processing chamber which is airtight and accommodates a target substrate, and a support member which supports the substrate in the processing chamber, the method comprising:

performing a dehydration treatment which removes water present in the processing chamber;

performing a halogenation treatment after the dehydration treatment by supplying a treatment gas containing a halogenating gas into the processing chamber and heating the support member, the halogenation treatment being so performed as to halogenate a metal element in a by-product film attaching to the support member, thereby removing the metal element from the support member;

performing a reduction treatment after the halogenation treatment by supplying a treatment gas containing a reducing gas into the processing chamber, the reduction treatment being so performed as to reduce a metal element halide produced by the halogenation treatment and attaching to a casing wall of the processing chamber, thereby liberating a metal element; and performing an oxidation treatment after the reduction treatment by supplying a treatment gas containing an oxidizing gas into the processing chamber and heating the casing wall of the processing chamber, the oxidation treatment being so performed as to oxidize and thereby passivate the metal element liberated by the reduction treatment on the casing wall of the processing chamber.

14. The method according to claim 13, wherein in the dehydration treatment, a treatment gas containing a reductive dehydrating gas is supplied into the processing chamber and allowed to react with water.

15. The method according to claim 13, wherein the halogenating gas is selected from the group consisting of a halogen, interhalogen compound, hydrogen halide, nitride halide, and carbon halide, and a temperature of the support member of the processing chamber is set at 200 to 600° C. in the halogenation treatment.

16. The method according to claim 13, wherein the reducing gas is selected from the group consisting of $SiH_4$ and $Si_2H_6$, and a temperature of the casing wall of the processing chamber is set at room temperature to 200° C. in the reduction treatment.

17. The method according to claim 13, wherein the oxidizing gas is selected from the group consisting of $O_2$, $N_2O$, $NO_2$, NO, and $O_3$, and a temperature of the casing wall of the processing chamber is set at 500 to 1,000° C. in the oxidation treatment.

18. The method according to claim 13, wherein in one or a plurality of the dehydration treatment, halogenation treatment, reduction treatment, and oxidation treatment, evacuation of the processing chamber and supply of the treatment gas are alternately repeated.

19. The method according to claim 14, wherein the dehydrating gas is silicon hydride.

20. The method according to claim 19, wherein a temperature of the casing wall of the processing chamber is set at room temperature to 200° C. in the dehydration treatment.

* * * * *